(12) United States Patent
Takagishi (10) Patent No.: US 7,046,727 B2
(45) Date of Patent: May 16, 2006

(54) METHOD AND APPARATUS FOR SELF-OSCILLATING DIFFERENTIAL FEEDBACK CLASS-D AMPLIFIER

(75) Inventor: Hideto Takagishi, San Jose, CA (US)

(73) Assignee: Monolithic Power Systems, Inc., Los Gatos, CA (US)

( * ) Notice: Subject to any disclaimer, the term of this patent is extended or adjusted under 35 U.S.C. 154(b) by 65 days.

(21) Appl. No.: 10/839,755

(22) Filed: May 5, 2004

(65) Prior Publication Data
US 2005/0248398 A1    Nov. 10, 2005

(51) Int. Cl.
*H03K 7/08* (2006.01)
(52) U.S. Cl. ......................................... 375/238; 330/10
(58) Field of Classification Search ................. 330/10, 330/124 R, 295, 251, 207 A; 375/238
See application file for complete search history.

(56) References Cited

U.S. PATENT DOCUMENTS 4,042,890 A * 8/1977 Eckerle .................. 330/207 A 4,887,045 A * 12/1989 Nakayama .................... 330/69

FOREIGN PATENT DOCUMENTS

JP          58-119212       *   7/1983

* cited by examiner

*Primary Examiner*—Henry Choe
(74) *Attorney, Agent, or Firm*—Perkins Coie LLP; Zhou Lu (57) ABSTRACT

The present disclosure introduces a simple method and apparatus for a Class-D amplification and Pulse Width Modulation (PWM) of an input signal, such as a voice signal. The proposed circuits do not require reference input signals such as triangular signals; rather, the combination of the circuits' self-oscillating device arrangements and the delay elements performs pulse width modulation at higher frequencies while producing less noise. Among other advantages, these circuits offer shorter response time, less distortion, better power supply ripple rejection, larger negative feedback, and simpler construction. The recommended Class-D amplifiers can be used with speakers and can have single-ended or differential input.

34 Claims, 9 Drawing Sheets

FIG. 9 though the invention can be practiced without one or more of the specific details, or with other methods, components, materials, etc. In other instances, well-known structures, materials, or operations are not shown or described in detail to avoid obscuring aspects of the invention.

METHOD AND APPARATUS FOR SELF-OSCILLATING DIFFERENTIAL FEEDBACK CLASS-D AMPLIFIER

TECHNICAL FIELD

The present invention relates to audio signal processing and, in particular, to a system that includes a Class-D amplifier for audio signal amplification and other audio signal processing.

BACKGROUND

A Class-D switching amplifier, which is often desirable for amplification of audio signals, is substantially similar to Class-A, Class-B, and Class-AB, with a major difference in the signals provided to the output stage. Instead of feeding the audio waveform directly to the output stage, Class-D amplifiers modulate the audio waveforms as on-off pulses using duty-cycle modulation methods such as Pulse Duty-Cycle Modulation (PDM) or Pulse Width Modulation (PWM), before feeding the signal to the output stage.

By using transistors and semiconductors as switches rather than as linear amplifiers, the modulation stage rapidly switches the output stage on and off with the width, in the case of PWM, varying as a function of the audio signal. Subsequently, sound is recreated by filtering the signal—usually by low-pass filtering the switching signal—at the output, resulting in an amplified version of the analog input signal. Class-D amplifiers typically use triangular reference waveform as the comparison signal for modulation. In practice, high-frequency modulation is required to make a smooth waveform at the speaker. The switching scheme makes Class-D amplifiers more efficient and smaller in size, with less wasted heat energy and a smaller power supply. Class-D amplifiers are much more efficient than the non-switching linear amplifiers.

Existing Class-D amplifiers suffer numerous shortcomings in areas including modulation, feedback, distortion, power supply ripple rejection, response time, isolation, and last stage filtering. The triangular waveform, for modulation purposes, by itself is the cause of several problems in Class-D amplifiers such as superimposed high frequency noise, which is a source of distortion. Pulse transient damping issues, at frequencies above 1 kHz are another source of distortion in Class-D amplifiers.

As a result of the above-mentioned problems and other identified disadvantages in the art, there is a need for an improved Class-D audio amplifier without the triangular or other reference input signal that can operate in the several hundred kilohertz range.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION

Embodiments of a method and apparatus for a Class-D amplification and pulse Width Modulation (PWM) of an input signal, such as a voice signal, are described in detail herein. The proposed circuits do not require reference input signals, such as triangular signals. The combination of the circuits' self-oscillating device arrangements and the delay elements performs PWM at higher frequencies than the traditional Class-D circuits, while producing less noise.

In the following description, some specific details, such as example values for the circuit components, are presented to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the uses of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
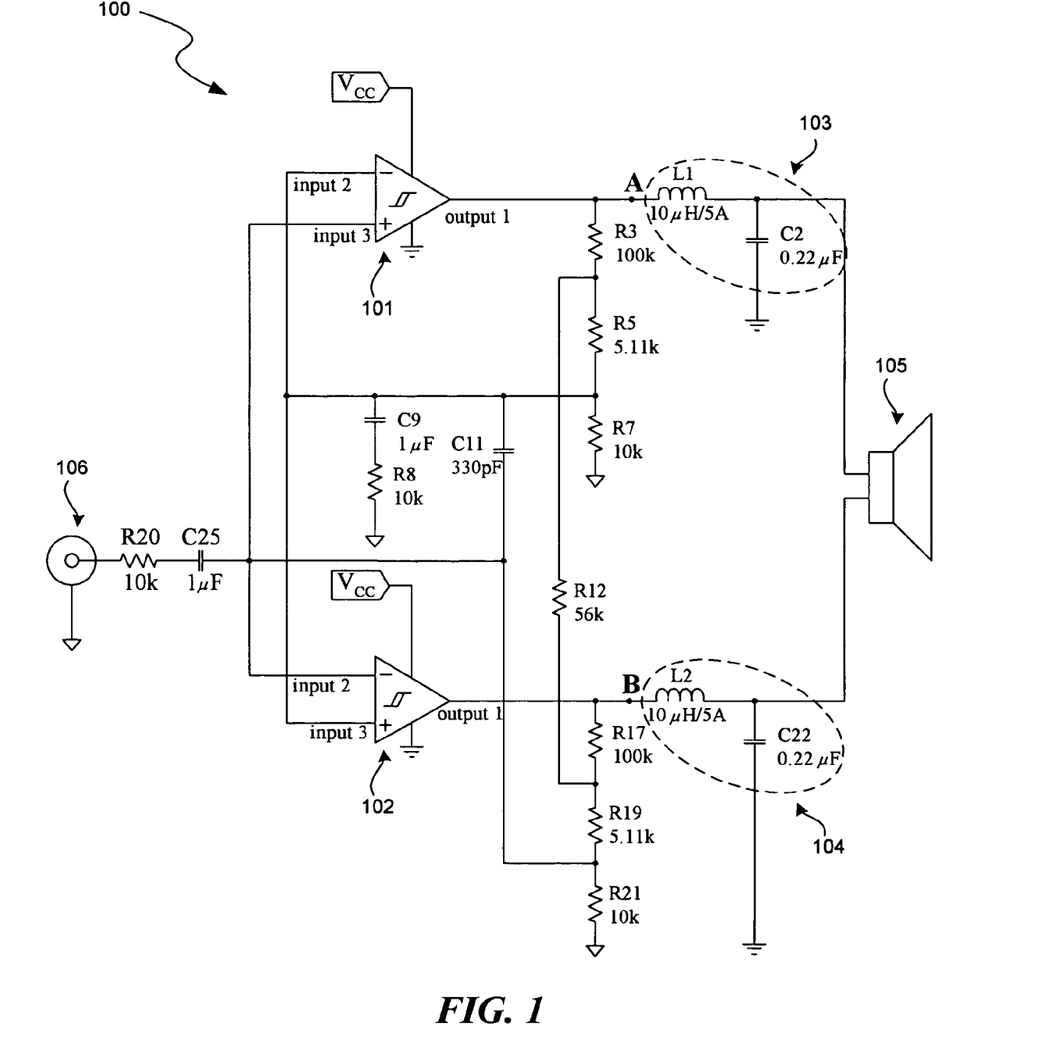
FIG. 1 is a schematic circuit diagram of a self-oscillating differential feedback Class-D amplifier, in accordance with an embodiment of the present invention.

FIG. 1 is a schematic circuit diagram of a self-oscillating differential feedback Class-D amplifier, in accordance with an embodiment of the present invention. A circuit 100 comprises two comparators 101 and 102, a number of resistors and capacitors, and two external low-pass filters 103 and 104 to recreate the original signal before it enters a speaker 105. In this embodiment an input jack 106 is an example of any possible input signal to this circuit. For the purpose of explanation, the input signal ranges between 0 to 1 volt, while $V_{cc}$ is 24 volts.

Furthermore, in this embodiment a resistance R12 enhances the gain of the amplifier. It is known to the one skilled in the art that R12 is not necessary for the operation of this circuit. A resistance R8 and a capacitance C9 also are not vital to the basic operation of the amplifier—they merely match an input resistance R20 and a capacitance C25 to prevent the audible clicking and popping sound during the turn-on and turn-off.

A capacitor C11 has a major role in delay creation in the feedback path of the comparators and consequently in the generation and control of the oscillation frequency of the amplifier. The inherent internal delays of the comparators 101 and 102, or their hysteresis, are also a key factor in the self-oscillation of the amplifier and its frequency. Resistors R3, R5, R7, R17, R19, and R21 form the basic blocks of the feedback circuitry or the feedback element of the two comparators 101 and 102, and, in conjunction with the R12, they produce the gain of the amplifier.

To demonstrate the self-oscillation of the circuit, a point in time may be assumed when the input to the circuit is a constant voltage, the voltage at an input3 of the comparator 101 rises over its input2, and the voltage at an input2 of the comparator 102 rises over its input3. After a time equal to the internal delay of the comparators—assuming the same time delay—an output1 of the comparator 101 changes from low to high and the output1 of the comparator 102 changes from high to low. At this instance the capacitor C11 starts discharging and subsequently charging to the reverse polarity.

As the C11 goes through this polarity inversion, it lowers the voltage at the input3 of the comparator 101 and the input2 of the comparator 102 while raising the voltage at the input2 of the comparator 101 and the input3 of the comparator 102 until the voltage at the input3 of the comparator 101 is lower than its input2 and the voltage at the input2 of the comparator 102 is lower than its input3, at which time the comparators are triggered and their outputs switch after a time delay. Once the outputs of the comparators switch, the entire process reverses and the discharging and charging of the capacitor C11 will cause yet another output switch. As evident from this process, aside from the internal delay of the comparators or their hysteresis behavior, the speed of charging and discharging of the C11, or in other words the capacitance of the C11, controls the speed of switching.

The PWM operation of the circuit 100 is as follows. Because the input voltage to the amplifier circuit is capacitively coupled to the feedback loop of the comparators, its variations will be imposed on the naturally varying voltage differences of the inputs to the comparators described above. For example, if at a point in time the input3 of the comparator 101 is decreasing, an increasing input to the amplifier circuit will oppose its decrease for the entire duration of time such input to the amplifier circuit is rising. Such phenomenon will delay the switching of the comparators' outputs in proportion to the rise of the said input, and results in pulse width modulation of the comparators' outputs. In another embodiment of this invention, op-amps may be substituted for comparators. One skilled in the art realizes that op-amps can be configured to replace comparators in different embodiments of the present invention.

Figure 2:
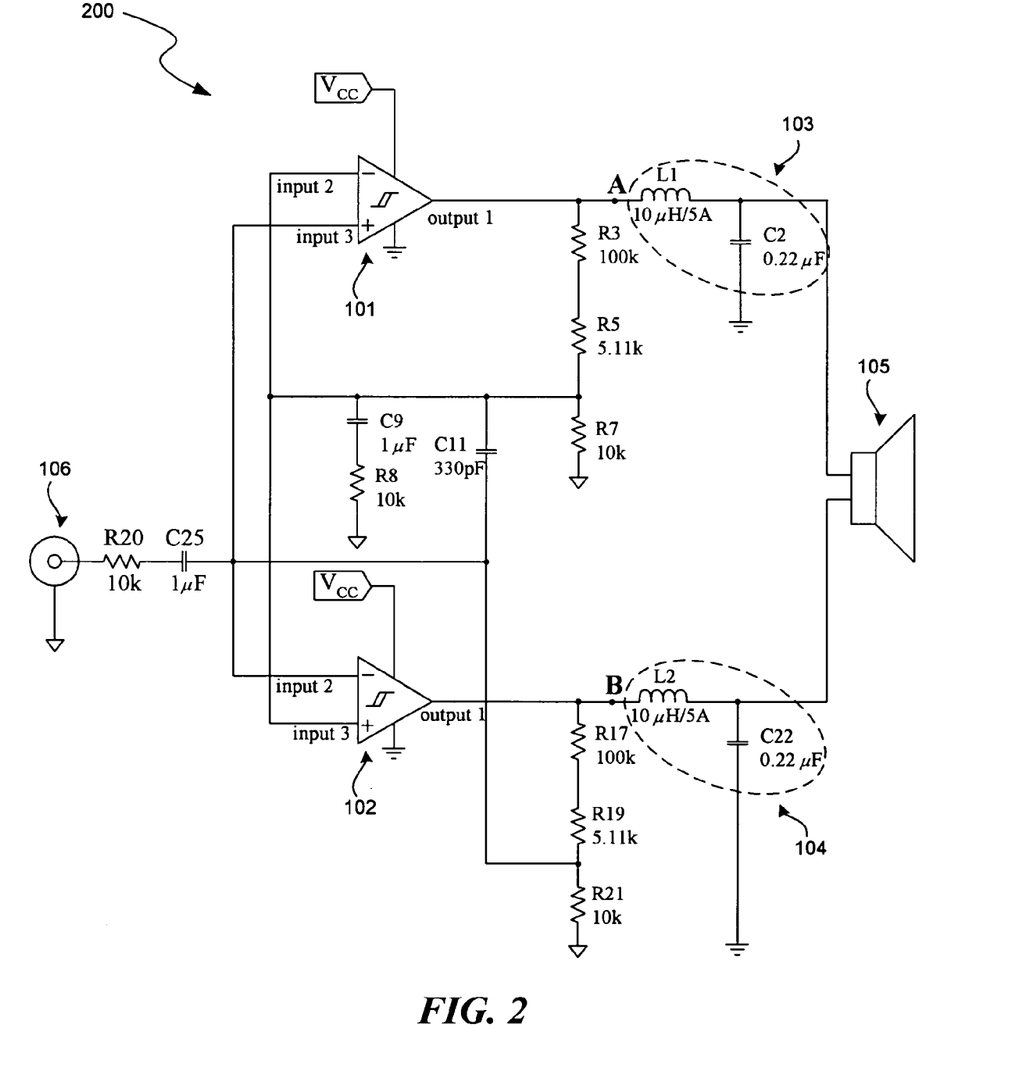
FIG. 2 is a schematic circuit diagram of a self-oscillating differential feedback Class-D amplifier, in accordance with another embodiment of the present invention.

FIG. 2 is a schematic circuit diagram of a self-oscillating differential feedback Class-D amplifier, in accordance with another embodiment of the present invention. A circuit 200 in FIG. 2 is analogous to the circuit 100 of FIG. 1 and bears like numbers. More specifically, the main difference between the circuit 100 and the circuit 200 is the absence of the R12 resistor in the circuit 200. The behavior of the circuit 200 is similar to the behavior of the circuit 100 while offering a lower gain.

Figure 3:
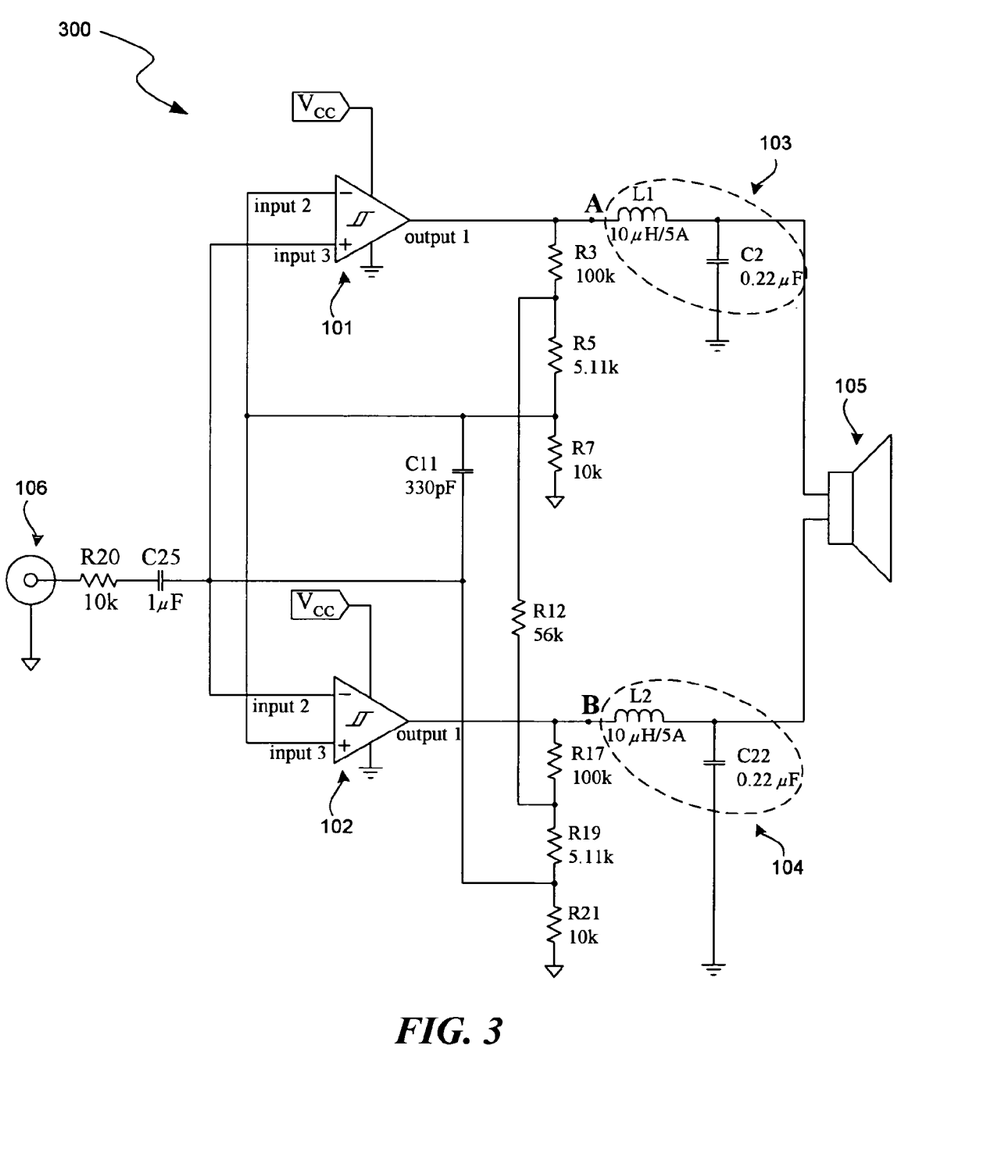
FIG. 3 is a schematic circuit diagram of a self-oscillating differential feedback Class-D amplifier, in accordance with yet another embodiment of the present invention.

FIG. 3 is a schematic circuit diagram of a self-oscillating differential feedback Class-D amplifier, in accordance with yet another embodiment of the present invention. A circuit 300 in FIG. 3 is analogous to the circuit 100 of FIG. 1 and bears like numbers. More specifically, the main difference between the circuit 100 and the circuit 300 is the absence of the R8 resistor and the C9 capacitor in the circuit 300. The behavior of the circuit 300 is similar to the behavior of the circuit 100, except for a clicking or popping sound which circuit 300 may make whenever the circuit is turned off or on.

Figure 4:
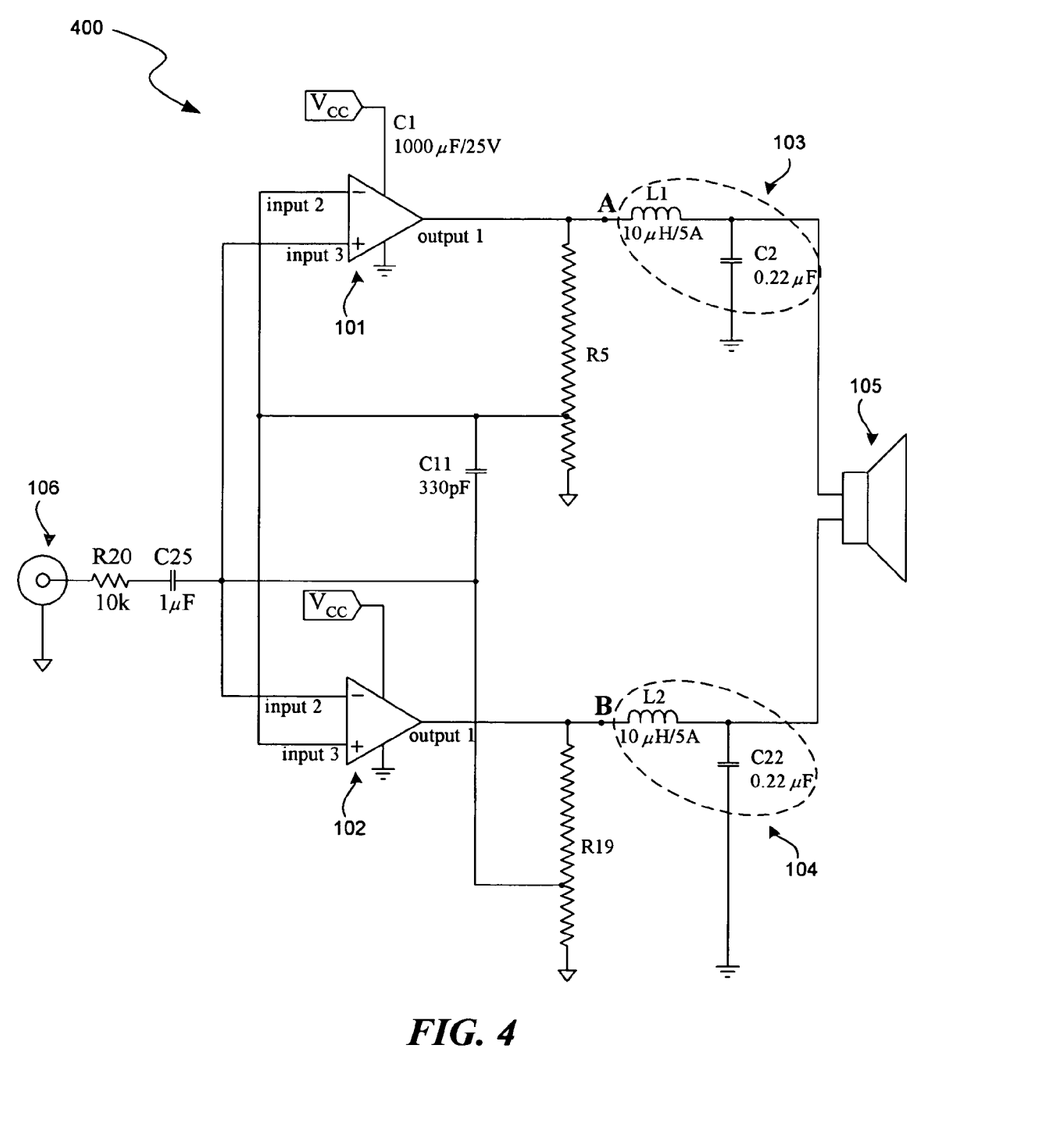
FIG. 4 is a schematic circuit diagram of a self-oscillating differential feedback Class-D amplifier, in accordance with yet another embodiment of the present invention.

It is also possible to configure the self-oscillating differential feedback Class-D amplifier as depicted in FIG. 4, which is yet another embodiment of the present invention. A circuit 400 in FIG. 4 is analogous to the circuit 100 of FIG. 1 and bears similar numbers. More specifically, the main difference between the circuit 100 and the circuit 400 is the absence of the R12 and R8 resistors and the C9 capacitor in the circuit 400. The behavior of the circuit 400 is similar to the behavior of the circuit 100, except for a lower gain and a clicking or popping sound which circuit 400 may make whenever the circuit is turned off or on. Suitable values for the resistors and the capacitors in FIG. 4 would be known by those skilled in the art based on the description of the embodiments provided herein.

Figure 5:
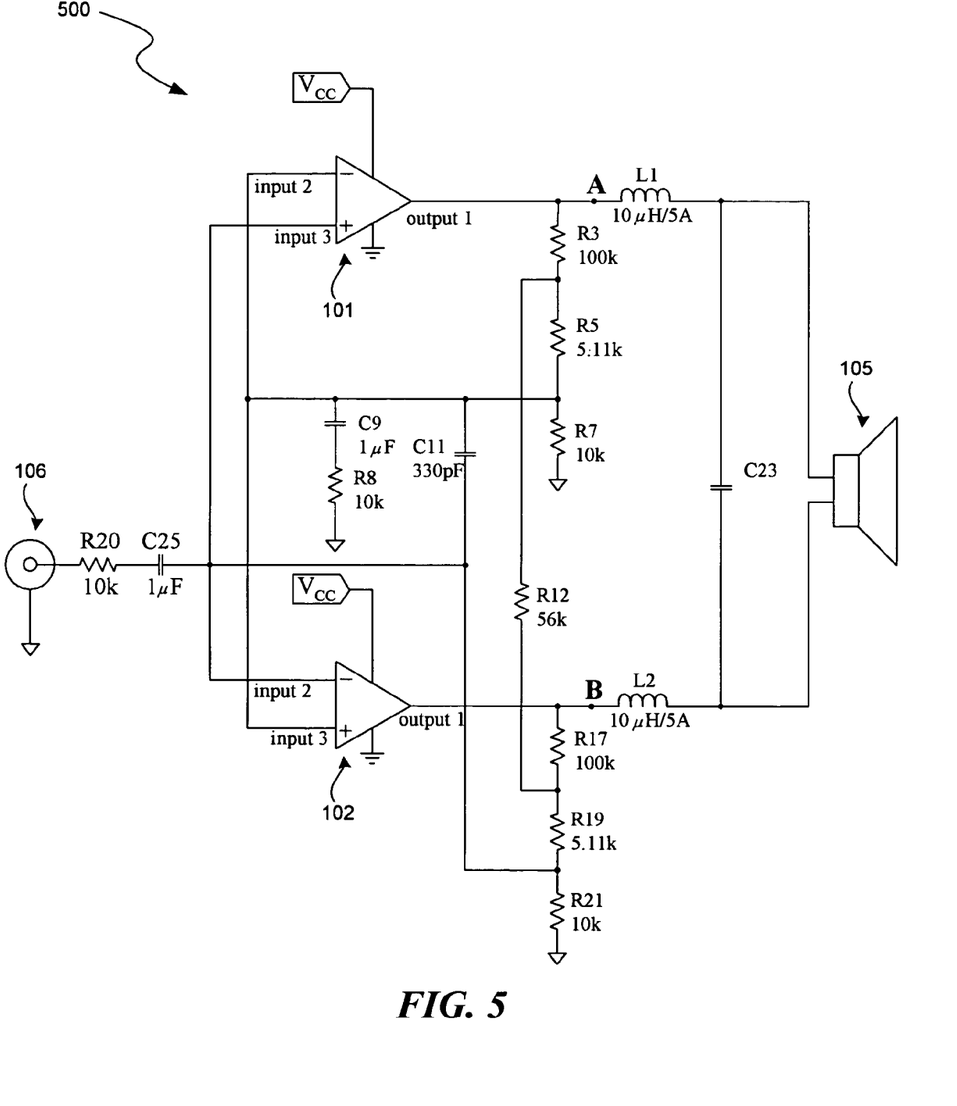
FIG. 5 is a schematic circuit diagram of a self-oscillating differential feedback Class-D amplifier, in accordance with yet another embodiment of the present invention.

FIG. 5 is a schematic circuit diagram of a self-oscillating differential feedback Class-D amplifier, in accordance with yet another embodiment of the present invention. A circuit 500 in FIG. 5 is analogous to the circuit 100 of FIG. 1 and bears like numbers. More specifically, the main difference between the circuit 100 and the circuit 500 is the replacement of the external capacitors C2 and C22 of circuit 100 by a single capacitor C23 in the circuit 500, which is in parallel with the load. The behavior of the circuit 500 is similar to the behavior of the circuit 100.

Figure 6:
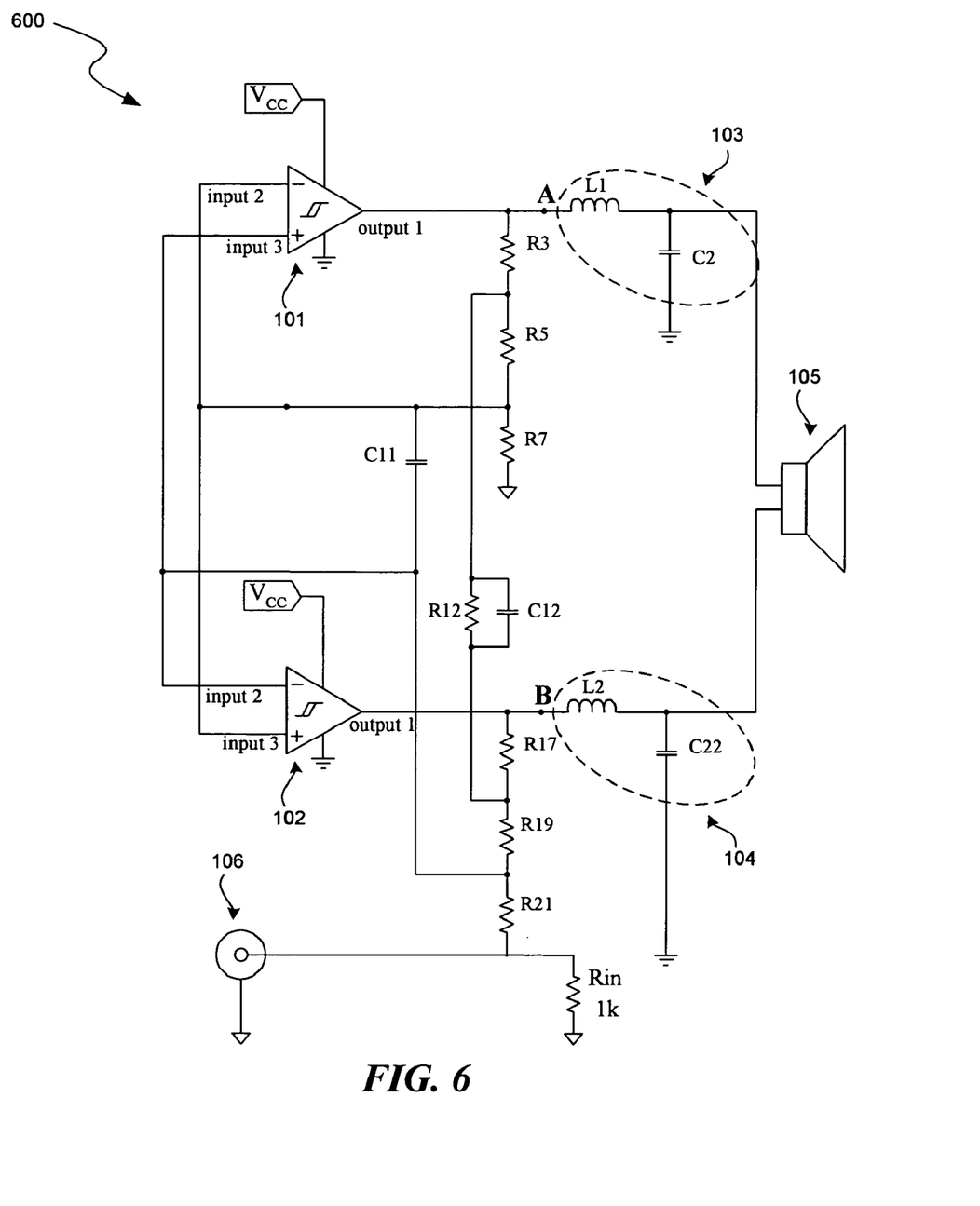
FIG. 6 is a schematic circuit diagram of a self-oscillating differential feedback Class-D amplifier, in accordance with yet another embodiment of the present invention.

FIG. 6 is a schematic circuit diagram of a self-oscillating differential feedback Class-D amplifier, in accordance with another embodiment of the present invention. A circuit 600 in FIG. 6 is analogous to the circuit 100 of FIG. 1 and bears like numbers. More specifically, the main difference between the circuit 100 and the circuit 600 is the absence of the DC-decoupling capacitor C25 in the circuit 600 and the addition of a capacitor C12 in parallel with the resistor R12. This circuit gives the user a choice if, for example, the input is a single-ended signal with no DC component. The behavior of the circuit 600 is similar to the behavior of the circuit 100.

Figure 7:
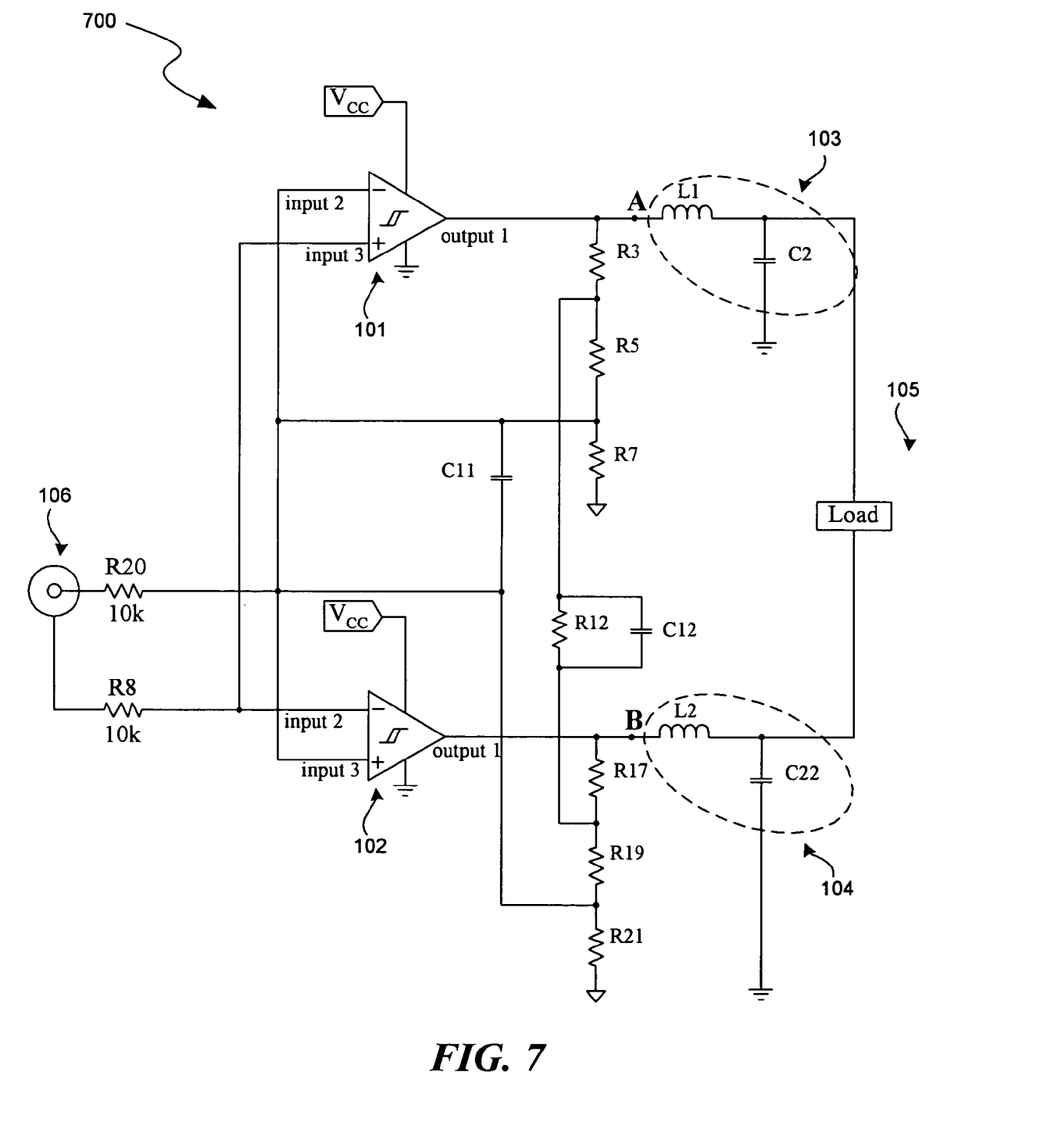
FIG. 7 is a schematic circuit diagram of a self-oscillating differential feedback Class-D amplifier, in accordance with yet another embodiment of the present invention.

FIG. 7 is a schematic circuit diagram of a self-oscillating differential feedback Class-D amplifier, in accordance with yet another embodiment of the present invention. A circuit 700 in FIG. 7 is analogous to the circuit 100 of FIG. 1 and bears like numbers. More specifically, the main difference between the circuit 100 and the circuit 700 is the absence of the DC-decoupling capacitor C25, connection of the input jack to the feedback loop such that it creates a differential input, and the addition of a capacitor C12 in parallel with the resistor R12. This circuit gives the user a choice of, for example, using the circuit as a class-D differential amplifier or using it with a single-ended input signal. The behavior of the circuit 700 is similar to the behavior of the circuit 100.

Figure 8:
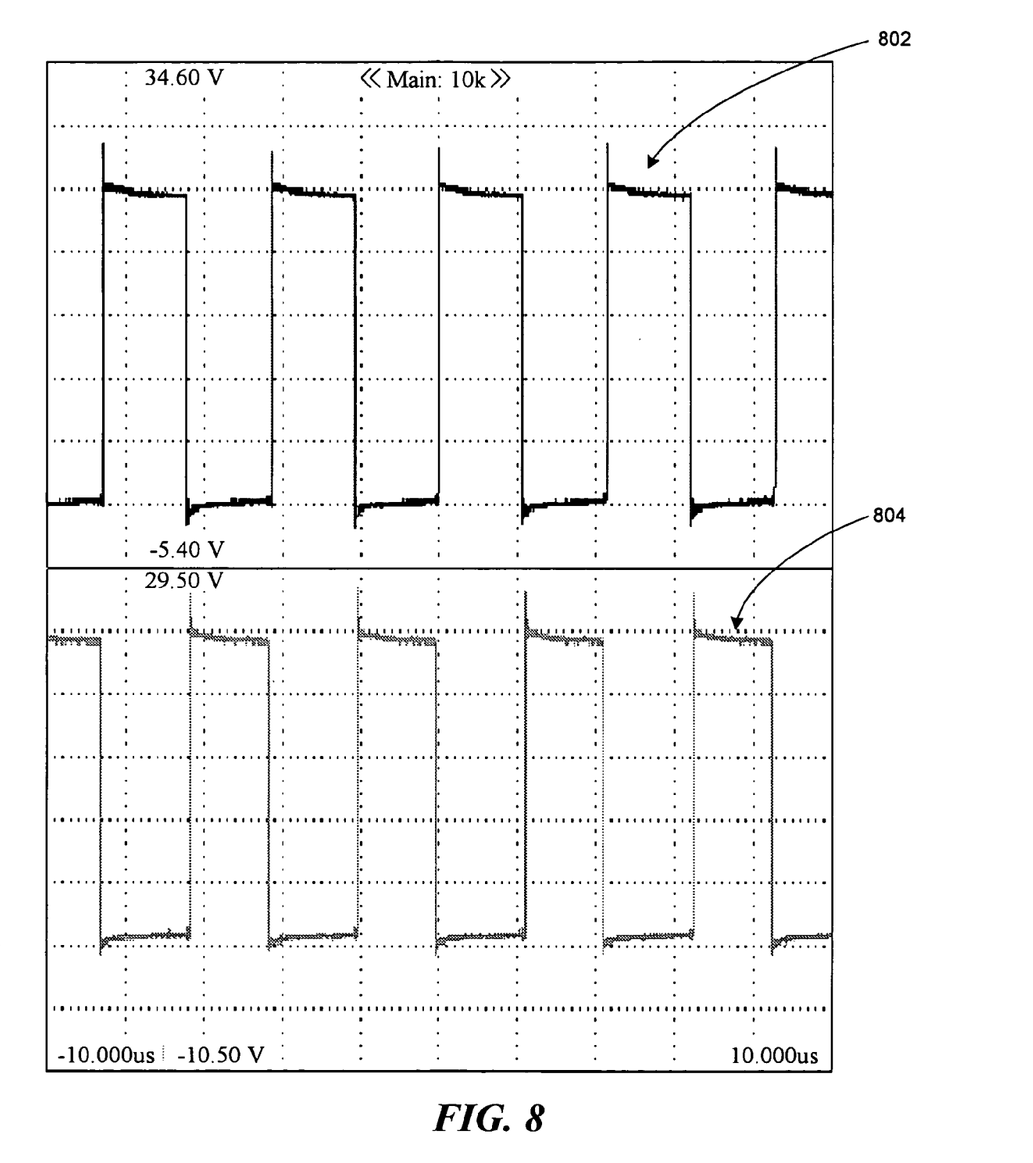
FIG. 8 is a graph of the test results of the self-oscillating differential feedback Class-D amplifier of FIG. 1.

FIG. 8 is a graph of the test results of the self-oscillating differential feedback Class-D amplifier of FIG. 1. A graph 802 of FIG. 8 depicts the behavior of the circuit at point A, and a graph 804 depicts its behavior at point B of the circuit 100. The test has been performed with a $V_{cc}$ of 24 volts and a duty cycle of 50%.

Figure 9:
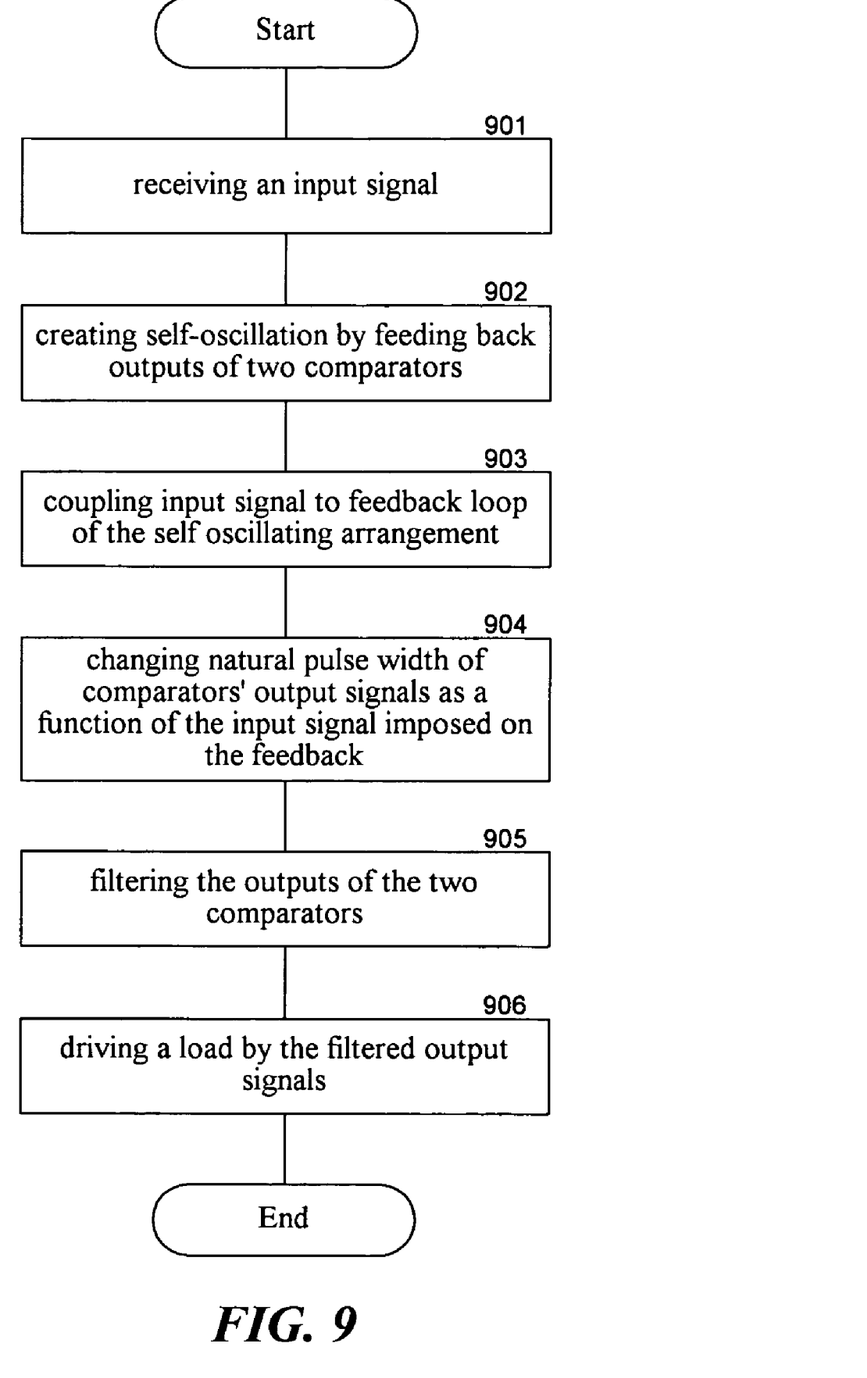
FIG. 9 is a flow diagram of the pulse width modulation and amplification method, in accordance with an embodiment of the present invention.

FIG. 9 is a flow diagram of the pulse width modulation and amplification method, in accordance with an embodiment of the present invention. At step 901 an input signal, such as a voice signal, is received. At step 902, using two comparators and a feedback circuitry, a self-oscillating arrangement is created wherein one comparator's output signal is the complement of the other comparator's output signal, while oscillating. At step 903 the input signal is coupled, for example capacitively, to the feedback loop of the above-mentioned self-oscillating arrangement. At step 904 the natural pulse width of the comparators' output signals is changed as a function of the input signal, through the imposition of the input signal on the feedback signals. At step 905 the outputs of the two comparators are passed through low-pass filters, and subsequently at step 906 a load is driven by the filtered output signals.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

For instance, while specific component values and voltage supply values are provided herein, it is to be appreciated that these values are for the sake of illustration and explanation. Various embodiments of the invention may utilize values that are different from what is specified herein.

These modifications can be made to the invention in light of the above-detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A self-oscillating apparatus for pulse width modulation of an input signal, comprising:
   a network of at least two comparators, a first comparator and a second comparator;
   a feedback element comprising at least two resistors and one capacitor, the feedback element being coupled with the network of the at least two comparators and with the input signal such that the feedback element causes self-oscillation of the network and the at least one capacitor controls the oscillation frequency; and
   a feedback configuration wherein an inverting input of the first comparator and a non-inverting input of the second comparator are connected to an output of the first comparator and an inverting input of the second comparator and a non-inverting input of the first comparator are connected to an output of the second comparator.

2. The apparatus of claim 1, wherein the input signal is single-ended.

3. The apparatus of claim 1, wherein the input signal is an audio signal.

4. The apparatus of claim 1, wherein the input signal is a differential input signal.

5. The apparatus of claim 1, wherein the input signal is DC blocked.

6. The apparatus of claim 1, wherein the input signal is not DC blocked.

7. The apparatus of claim 1, wherein the outputs of the at least two comparators are complementary.

8. The apparatus of claim 1, wherein the outputs of the at least two comparators are low-pass-filtered.

9. A self-oscillating apparatus for pulse width modulation of an input signal, comprising:
   a network of at least two comparators, a first comparator and a second comparator, for generating two complementary output signals; and
   a feedback element comprising at least two resistors and one capacitor, the feedback element being coupled with the network of the at least two comparators and with the input signal such that the feedback element causes self-oscillation of the network and the at least one capacitor controls the oscillation frequency; and
   a feedback configuration wherein an inverting input of the first comparator and a non-inverting input of the second comparator are connected, through a resistive connection, to an output of the first comparator and an inverting input of the second comparator and a non-inverting input of the first comparator are connected, through a resistive connection, to an output of the second comparator.

10. The apparatus of claim 9, wherein the input signal is single-ended.

11. The apparatus of claim 9, wherein the input signal is an audio signal.

12. The apparatus of claim 9, wherein the input signal is a differential input signal.

13. The apparatus of claim 9, wherein the input signal is DC blocked.

14. The apparatus of claim 9, wherein the input signal is not DC blocked.

15. The apparatus of claim 9, wherein the outputs of the at least two comparators are low-pass-filtered.

16. A Class-D self-oscillating amplifier with pulse width modulation of an input signal, comprising:
   a network of at least two comparators, a first comparator and a second comparator, for generating two complementary output signals;
   a low-pass filter;
   a feedback element comprising at least two resistors and one capacitor, the feedback element being coupled with the network of the at least two comparators and being capacitively coupled with the input signal such that the feedback element causes self-oscillation of the network and the at least one capacitor controls the oscillation frequency; and
   a feedback configuration wherein an inverting input of the first comparator and a non-inverting input of the second comparator are connected, through a resistive connection, to an output of the first comparator and an inverting input of the second comparator and a non-inverting input of the first comparator are connected, through a resistive connection, to an output of the second comparator.

17. The apparatus of claim 16, wherein the input signal is single-ended.

18. The apparatus of claim 16, wherein the input signal is an audio signal.

19. The apparatus of claim 16, wherein the input signal is a differential input signal.

20. The apparatus of claim 16, wherein the input signal is DC blocked.

21. The apparatus of claim 16, wherein the input signal is not DC blocked.

22. The apparatus of claim 16, wherein the load is a speaker.

23. A Class-D self-oscillating amplifier with pulse width modulation of an input signal, comprising:
- a network of at least two op-amps, a first op-amp and a second op-amp, for generating two complementary output signals;
- a low-pass filter;
- a feedback element comprising at least two resistors and one capacitor, the feedback element being coupled with the network of the at least two comparators and being capacitively coupled with the input signal such that the feedback element causes self-oscillation of the network and the at least one capacitor controls the oscillation frequency; and
- a feedback configuration wherein an inverting input of the first op-amp and a non-inverting input of the second op-amp are connected to an output of the first op-amp and an inverting input of the second on-amp and a non-inverting input of the first op-amp are connected to an output of the second on-amp.

24. The apparatus of claim 23, wherein the input signal is single-ended.

25. The apparatus of claim 23, wherein the input signal is an audio signal.

26. The apparatus of claim 23, wherein the input signal is a differential input signal.

27. The apparatus of claim 23, wherein the input signal is DC blocked.

28. The apparatus of claim 23, wherein the input signal is not DC blocked.

29. The apparatus of claim 23, wherein the load is a speaker.

30. A method of pulse width modulation and amplification of an input signal, such as a voice signal, the method comprising:
- receiving an input signal;
- creating self-oscillation by feeding back the outputs of two comparators or two op-amps through a network of at least two resistors and one capacitor, wherein one comparator's or op-amp's output signal is the complement of the other comparator's or the other op-amp's output signal;
- coupling the input signal to the feedback loop of the self-oscillating arrangement; and
- changing the natural pulse width of the comparators' or op-amps' output signals as a function of the input signal.

31. A method of pulse width modulation and amplification of an input signal, such as a voice signal, the method comprising:
- receiving an input signal;
- creating self-oscillation by feeding back the outputs of two comparators or op-amps through a network of at least two resistors and one capacitor, wherein one comparator's or op-amp's output signal is the complement of the other comparator's or the other op-amp's output signal;
- coupling the input signal to the feedback loop of the self-oscillating arrangement;
- changing the natural pulse width of the comparators' or op-amps output signals as a function of the input signal;
- filtering the outputs of the two comparators or op-amps; and
- driving a load by the filtered output signals.

32. The method of claim 31, wherein filtering is performed by low-pass filters.

33. The method of claim 31, wherein the load is a speaker.

34. The method of claim 31, wherein the input signal is a voice signal.

* * * * *

UNITED STATES PATENT AND TRADEMARK OFFICE
CERTIFICATE OF CORRECTION

PATENT NO. : 7,046,727 B2
APPLICATION NO. : 10/839755
DATED : May 16, 2006
INVENTOR(S) : Hideto Takagishi

It is certified that error appears in the above-identified patent and that said Letters Patent is hereby corrected as shown below:

<u>Column 6</u>
Line 5, delete "and";

<u>Column 7</u>
Line 17, "on amp" should be --op-amp--;
Line 19, "on-amp" should be --op-amp--;

Signed and Sealed this

Fifteenth Day of August, 2006

JON W. DUDAS
*Director of the United States Patent and Trademark Office*